United States Patent
Ding et al.

(10) Patent No.: US 9,281,256 B2
(45) Date of Patent: Mar. 8, 2016

(54) PACKAGE ENCAPSULANT RELIEF FEATURE

(71) Applicants: Min Ding, Austin, TX (US); Tim V. Pham, Austin, TX (US)

(72) Inventors: Min Ding, Austin, TX (US); Tim V. Pham, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/035,999

(22) Filed: Sep. 25, 2013

(65) Prior Publication Data

US 2015/0084168 A1    Mar. 26, 2015

(51) Int. Cl.
*H01L 23/495* (2006.01)
*H01L 23/31* (2006.01)
*H01L 23/00* (2006.01)

(52) U.S. Cl.
CPC ........ *H01L 23/3107* (2013.01); *H01L 23/3121* (2013.01); *H01L 23/49555* (2013.01); *H01L 23/562* (2013.01); *H01L 2224/32245* (2013.01); *H01L 2224/48091* (2013.01); *H01L 2224/48247* (2013.01); *H01L 2224/73265* (2013.01); *H01L 2924/1815* (2013.01)

(58) Field of Classification Search
None
See application file for complete search history.

(56) References Cited

U.S. PATENT DOCUMENTS

| 5,195,023 | A | | 3/1993 | Manzione et al. |
| 5,835,355 | A | * | 11/1998 | Dordi ............................ 361/760 |
| 6,316,829 | B1 | * | 11/2001 | Boon ...................... H01L 23/16 257/644 |
| 2010/0025828 | A1 | * | 2/2010 | Sakai .................. B29C 45/0046 257/666 |
| 2010/0327421 | A1 | | 12/2010 | Luan |
| 2011/0244637 | A1 | | 10/2011 | Eu et al. |

* cited by examiner

*Primary Examiner* — Benjamin Sandvik
*Assistant Examiner* — Herve Assouman

(57) ABSTRACT

A microelectronic device package including a package substrate, microelectronic component disposed on a first surface of a first portion of the substrate, and encapsulant material surrounding the microelectronic electronic component. An exposed surface of the first portion of the substrate is exposed through an opening in a first major surface of the encapsulant material. The exposed surface of the first portion has an edge. Encapsulant material is adjacent to the edge at the first major surface. The exposed surface is opposite the first surface. A stress relief feature located in one of the first major surface or a second major surface of the encapsulant material. The second major surface is opposite the first major surface. The stress relief feature reduces an amount of the encapsulant material and is 1 mm or less of a plane of the edge of the exposed surface. The plane is generally perpendicular to the exposed surface.

20 Claims, 5 Drawing Sheets

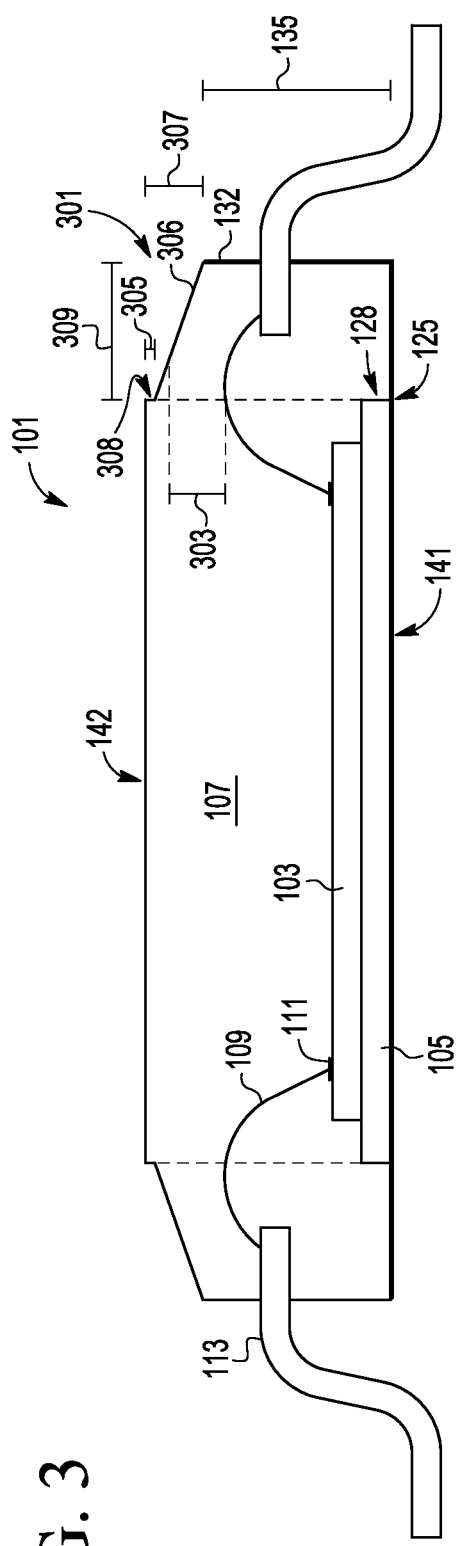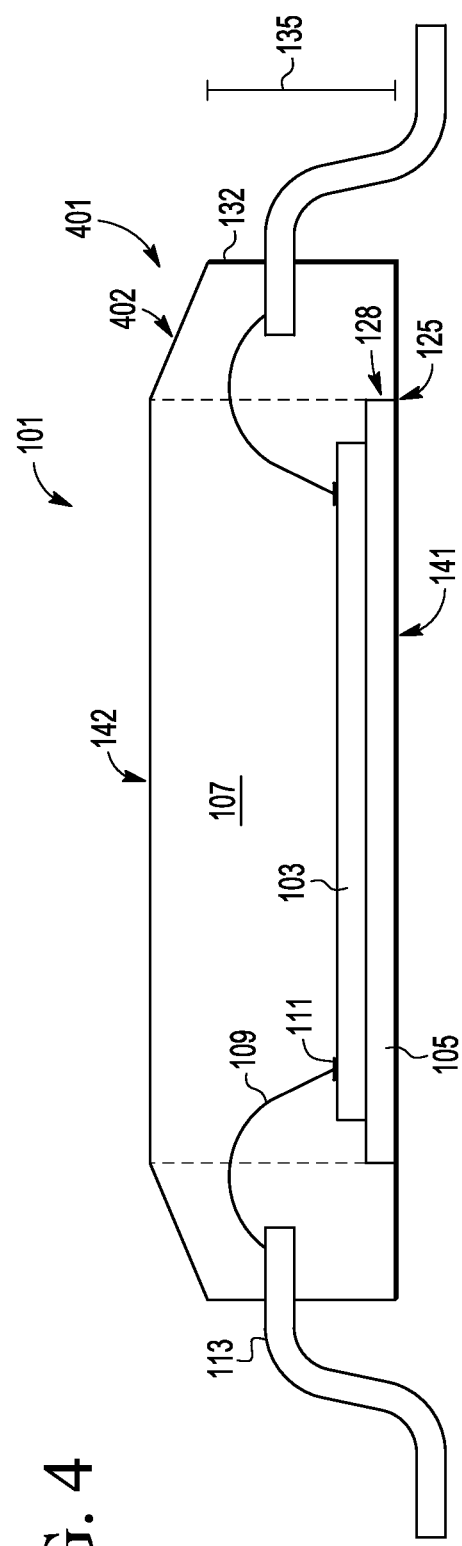

PACKAGE ENCAPSULANT RELIEF FEATURE

BACKGROUND OF THE INVENTION

1. Field of the Invention

This invention relates in general to microelectronic device packages.

2. Description of the Related Art

Some microelectronic devices such as integrated circuits are implemented in die singulated from semiconductor wafers. Examples of microelectronic devices include processors, memory, logic, analog circuitry, sensors, MEMS devices, and stand alone discrete devices such as resistors, inductors, diodes, capacitors, and power transistors. Some microelectronic devices may be formed by other processes.

Microelectronic devices are utilized as packaged microelectronic devices where the device is encapsulated in an encapsulant for physical and/or environmental protection.

BRIEF DESCRIPTION OF THE DRAWINGS

The present invention may be better understood, and its numerous objects, features, and advantages made apparent to those skilled in the art by referencing the accompanying drawings.

FIG. 3 is a cutaway side view of a microelectronic device package according to another embodiment of the present invention.

FIG. 4 is a cutaway side view of a microelectronic device package according to another embodiment of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a microelectronic device package includes a stress relief feature in the encapsulant that provide for stress relief of the package. In one example, this cutout feature may prevent device flag delamination in a package with an exposed flag. Examples of a stress relief feature may include an edge cut out or a groove.

With some microelectronic packages, a mismatch in the coefficient of thermal expansion CTE of the different package materials may cause mechanical stress on the package (e.g. bending) that may lead to crack formation. Crack formation may result in the delamination of one structure from another structure. For example, for packages with an exposed die flag (or other type of device flag), cracks may develop between the die flag and the encapsulant or the die and the encapsulant. These cracks may grow over time due to temperature cycles which can lead to delamination.

Figure 1:
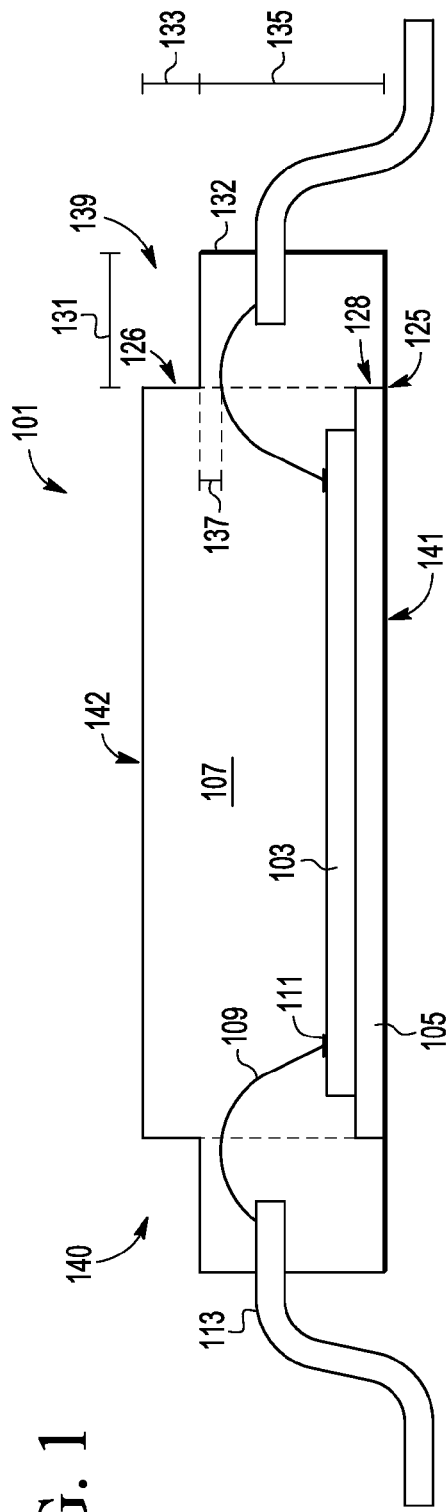
FIG. 1 is a cutaway side view of a microelectronic device package according to one embodiment of the present invention.

FIG. 1 is a cutaway side view of a microelectronic device package according to one embodiment of the present invention. Package 101 includes an encapsulated microelectronic device 103. In one embodiment, device 103 is implemented as a die that is formed from singulating a semiconductor wafer (not shown). In one embodiment, device 103 is an integrated circuit such as a processor, memory, logic, analog circuitry, sensor, or MEMS device, or a standalone discrete device such as a resistor, inductor, capacitor, diode, or power transistor. In some embodiments, device 103 may be a combination of the integrated circuit types listed above or may be another type of microelectronic device. In one embodiment, device 103 is a MOS power transistor. In some embodiments, the die includes a semiconductor material such as silicon, gallium nitride, or gallium arsenide.

Device 103 is attached to a die flag 105 of a leadframe. In the embodiment shown, the lead frame includes leads 113 that extend out of the package encapsulant 107. The lead frame is made of a conductive metal. In one embodiment, the lead frame metal is predominately copper or a copper alloy (e.g. 90% atomic weight or greater). In one embodiment, the lead frame has a thickness of 0.25 mm. The lead frame may be made of other materials and/or be of other thicknesses in other embodiments.

In the embodiment shown, package 101 includes wires 109 for connecting die pads 111 to leads 113. The wires are attached to the leads 113 and pads 111 by a wire bonding process. In other embodiments, the conductive structures of a die (e.g. pads, bumps, posts) may be electrically coupled to the lead frame in other ways such as where the die is attached with its active side face down such as in a flip chip configuration. Also in other embodiments, a package may include multiple microelectronic devices encapsulated together such as in a multi stack configuration or in a side by side configuration.

After the electrical coupling of pads (111) of device 103 to the leads (113) of lead frame, the device is encapsulated with an encapsulant 107. In one embodiment, encapsulant 107 is made of an encapsulant material such as a mold compound based on a biphenyl type or multi-aromatic type epoxy resin, but may be of other types of encapsulating material in other embodiments. The encapsulating may be performed by an encapsulating method such as transfer molding or other types of encapsulating methods.

In the embodiment shown, package 101 is characterized as a leaded package (either with leads on two or four sides). However in other embodiments, package 101 may have other configurations. For example, package 101 may be a leadless package (e.g. QFN), a ball grid array, or a land grid array.

In other embodiments, package 101 may have another type of package substrate other than a lead frame such as a plastic laminate substrate. In one embodiment, the package substrate is made of a dielectric material with conductive structures such plating, pads, interconnects, and/or vias for providing electrical connections from device 103 to external conductive package structures (e.g. solder balls (not shown)).

In order to reduce cracking and delamination, package 101 includes a corner cutout 139 that is located in the upper top major surface of the encapsulant 107. Cutout 139 is a stress relief feature that reduces the stress on the package at a location between the encapsulant 107 at the corner edge 125 of flag 105. Cutout 139 has a side wall 126 that is aligned (located in the same plane) to the edge 128 of flag 105. In other embodiments, the side wall 126 includes a portion that is located in a plane that is 1 mm or less from the plane of edge 128. In some embodiments, side wall 126 is located in a plane that is closer to the minor surface 132 of encapsulant 107 than edge 128. In other embodiments, side wall 126 is located in a plane that is further from surface 132 than edge 128.

In the embodiment shown, the depth of the cutout (dimension 133) is defined by the desired thickness of the package and a minimum distance (dimension 137) of the top of encapsulant 107 from wire 109. The width of the cutout (dimension 131) is defined by the distance of edge 128 to surface 132. Dimension 135 is the distance from the bottom of the cutout 139 to the bottom major surface 141. Package 101 includes a second cutout 140 located on opposing upper corner of the encapsulant 107. In the embodiment shown, cutouts 139 and 140 are characterized as having a step wise cross section.

In one embodiment, dimension 135 is 1.5 mm, dimension 131 is 2 mm, dimension 133 is 0.5 mm, and dimension 137 is 0.26 mm. However, these dimensions may be of other values in other embodiments.

The inclusion of cutout 139 removes material of the package 101. This reduces stress on the package, especially at corner edge 125, by removing encapsulant material that is furthest from the center of the package. Accordingly, providing the cutout enables a package to be at a required thickness (the distance between major surfaces 141 and 142) but yet enables the stress causing material to be removed.

Figure 7:
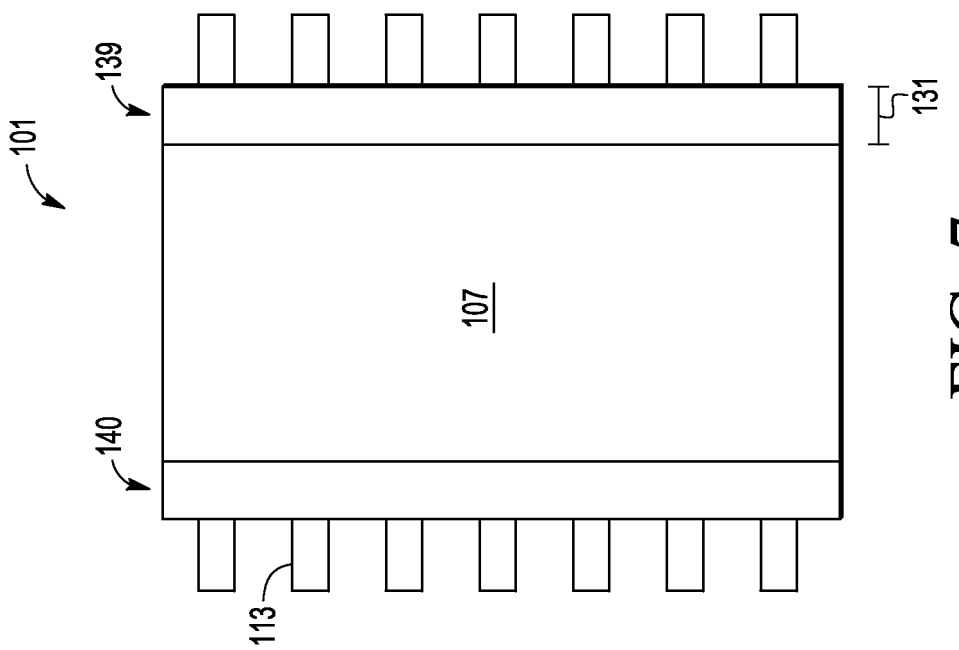
FIG. 7 is a top view of a microelectronic device package according to another embodiment of the present invention.

FIG. 7 shows a top view of package 101 according to one embodiment. In the view shown, package 101 includes leads (113) extending from two minor surfaces of package 101. Cutouts 139 and 140 are located along the sides of package 101 where the leads extend from. In other embodiments, cutouts may be located along all sides of the package.

In the embodiment shown, the cutouts are located all along a side of the package. However in other embodiments, the cutouts may be located on portions of a side. Still in other embodiments, each side may include multiple cutouts where each cutout only extends along a portion of a package side.

In one embodiment, package 101 has a width (horizontal direction of FIG. 7) of 10 mm and a length (vertical direction in FIG. 7) of 18 mm. The thickness of package 101 (into the page of FIG. 7) is 2.35 mm. Other packages may be of other dimensions in other embodiments.

In one embodiment, the cutouts are formed during encapsulation by corresponding structures in the encapsulation mold. In other embodiments, the cutouts may be formed by post encapsulation removal (e.g. by sawing, etching, or grinding).

Figure 2:
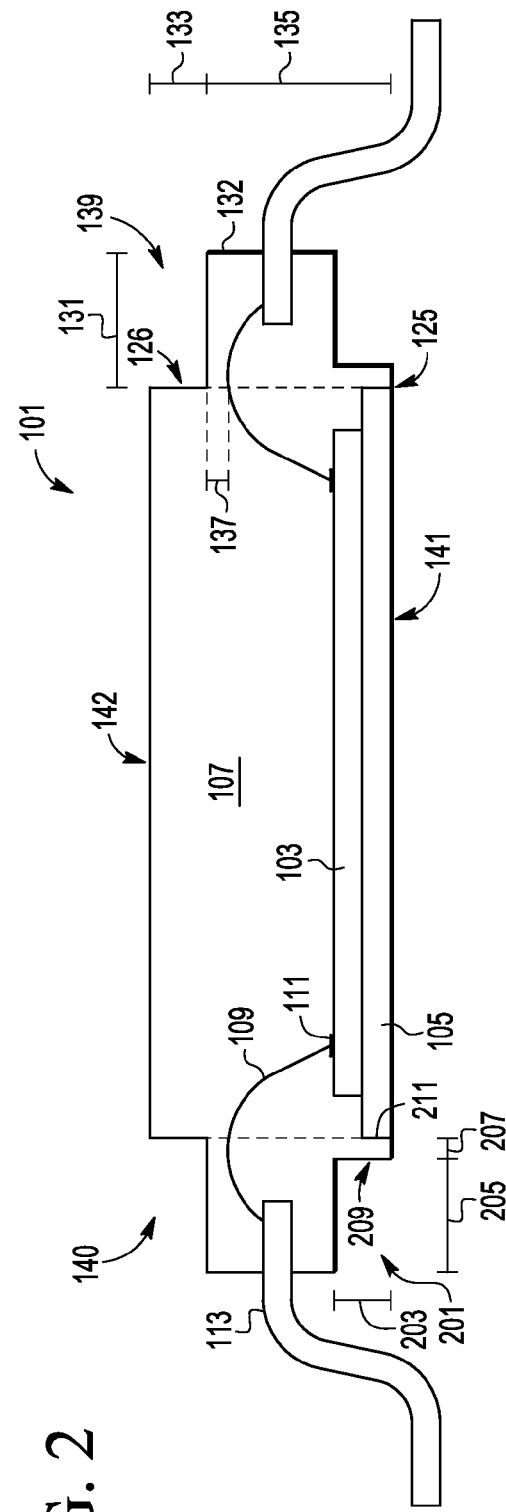
FIG. 2 is a cutaway side view of a microelectronic device package according to another embodiment of the present invention.

FIG. 2 shows a cutaway side view of another embodiment of a package with stress relief features according to another embodiment of the invention. The items of FIG. 2 that are similar to the items of FIG. 1 have the same reference numbers. The package of FIG. 2 in similar to the package of FIG. 1 except it includes bottom stress relief cutouts (201) that are located in the lower major surface 141 of package 101. The lower cutouts 201 have a side wall 209 that is located a distance of dimension 207 from the edge 211 of flag 105. In one embodiment, dimension 207 is 0.5 mm, but may be of other dimensions in other embodiments. One constraint on this dimension is the amount of encapsulant desired against the minor edge (211) of flag 105.

The depth (dimension 203) of cutout 201 is constrained by the amount of encapsulant 107 needed on the bottom of lead 113. In one embodiment, this amount is about 0.2 mm, but could be of other amounts in other embodiments.

Providing a cutout on a bottom of a package also removes material of the package 101 to reduce stress on the package by removing encapsulant material that is farthest from the center of the package.

FIG. 3 is a cutaway side view of a package according to another embodiment. In the embodiment of FIG. 3, cutout 301 has a different side profile than cutout 139 of FIG. 1. Cutout 301 includes a relatively short vertical side wall 308 and a sloped wall 306. The depth of the cutout (dimension 307) is constrained by the required clearance (dimension 303) for wires (109). In FIG. 3, side wall 308 is in a plane that is aligned with edge 128. However, the plane of side wall 308 may be offset from the edge 128. In one embodiment, this offset is 1 mm or less of edge 128. In another embodiment, the plane of side wall 308 is offset by 0.5 mm or less. In one embodiment, wall 306 slopes downward at an angle in the range of 10 to 25 degrees, but it may be sloped at different angles of in other embodiments.

Using a cutout feature with a sloped wall may allow for more material of encapsulant 107 to be removed, in some embodiments, in that the entire bottom of the cutout feature does not have to be at a margin above the highest point of wire 109. With a sloped wall, the lowest point of the slope (at surface 132) can be below the highest clearance point needed for wires 109. In FIG. 3, the slope of wall 306 is shown as being straight. However, in other embodiments, the slope may have a contour that follows the downward side of a wire 109 allowing for the removal of more encapsulant. In some embodiments, the bottom of the cutout would be limited by the amount of encapsulant needed at surface 132 to cover leads 113.

FIG. 4 shows a side view of another embodiment of a microelectronic device package. In the embodiment of FIG. 4, cutout 401 has a sloped wall 402 that extends from surface 142 to surface 132. In the embodiment shown, the slope wall 402 begins at surface 142 at a location that is located in the plane of corner edge 125 of flag 105. However, in other embodiments, the location of the beginning point of the slope of surface 142 may be in a plane that is offset from edge 125. In one embodiment, the offset is 1 mm or less.

In other embodiments, a cutout may have other shapes. For example, the shape of a cutout may have a vertical side wall and a flat bottom that extends to a slope side wall, which extends to the minor side wall of the package. In other embodiments, the cutout may have a vertical side wall, an intermediate sloped wall, and a bottom horizontal wall.

Figure 5:
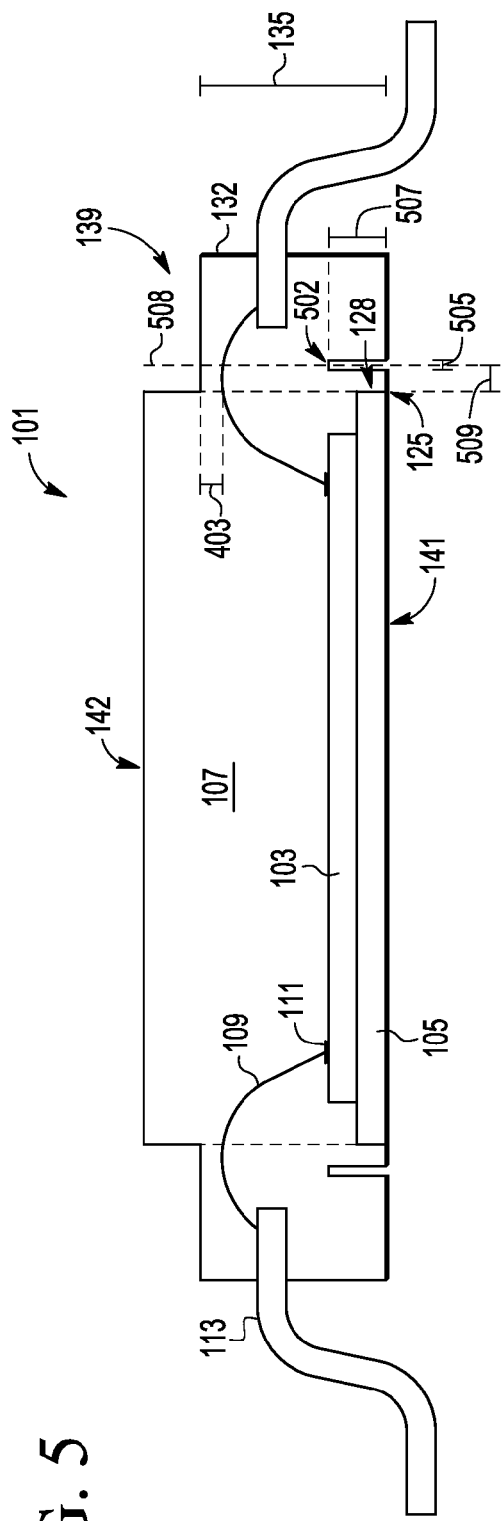
FIG. 5 is a cutaway side view of a microelectronic device package according to another embodiment of the present invention.
Figure 6:
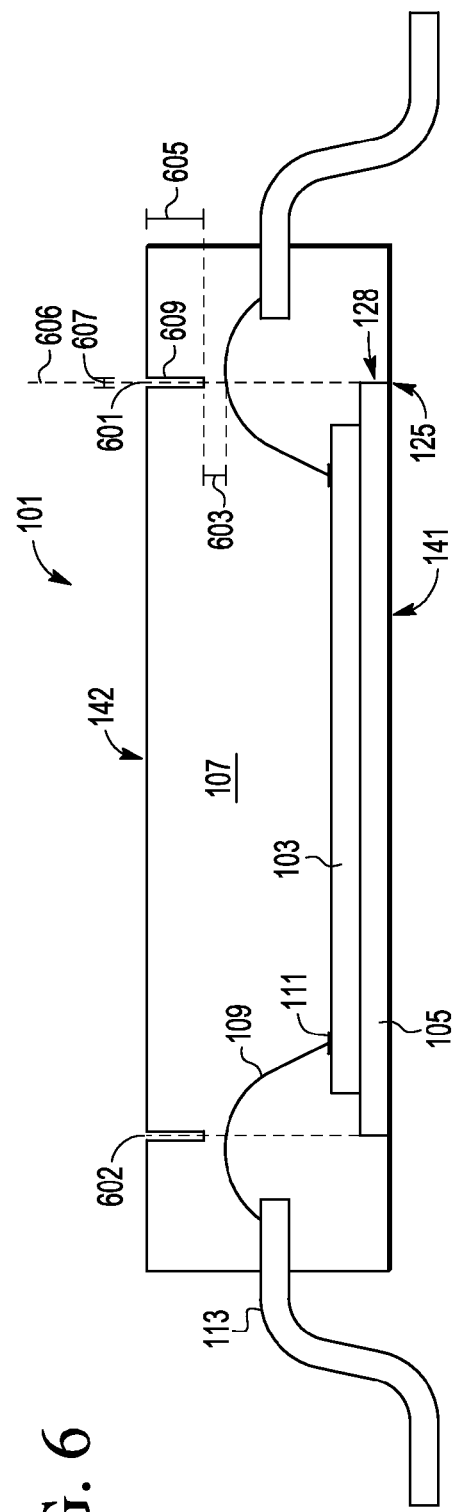
FIG. 6 is a cutaway side view of a microelectronic device package according to another embodiment of the present invention.

FIGS. 5 and 6 set forth embodiments where the stress relief features have a groove configuration. In FIG. 5, package 101 includes a bottom stress relief groove 502 that extends up in encapsulant 107 from package surface 141. In the embodiment shown, groove 502 has vertical side walls, but may have sloped side walls in other embodiments. In one embodiment, groove 502 has a depth (dimension 507) of 0.5 mm and a width of 0.15 mm (dimension 505), but may be of other dimensions in other embodiments.

In the embodiment shown, groove 502 has a center plane 508 that is offset from edge 125 by 0.3 mm (dimension 509), but may be offset by other amounts. A center plane of a groove is a plane located at the middle of a cross section of the opening in a surface defining the groove wherein the plane runs along a length of the groove. In one embodiment, the groove surrounds all sides of the die flag. However, in other embodiments, the groove surrounds only a part of the die flag. For example, the groove may be located along the sides of the flag having leads. In other embodiments, the groves would be located at intervals along a side.

FIG. 6 shows a side view of a device package where the package includes a groove 601 located in top surface 142. In the embodiment shown, groove 601 has a center plane 606 that is aligned with edge 125 of flag 105. In other embodiments, the center plane 606 may be offset from edge 125. In some examples, center plane 606 may be located 1 mm or less from edge 125 on either side of edge 125 relative to the view shown in FIG. 6.

In one embodiment, groove 601 has a depth (dimension 605) 0.5 mm, but may in the range of 1.25 mm or less. Still in other embodiments, groove 601 may have a depth of greater than 1.25 mm. In some embodiments, the depth of groove 601 is constrained by a clearance 603 from wires 109. In one embodiment, groove 601 has a width (dimension 607) of 0.15 mm, but may have other widths in other embodiments.

Figure 8:
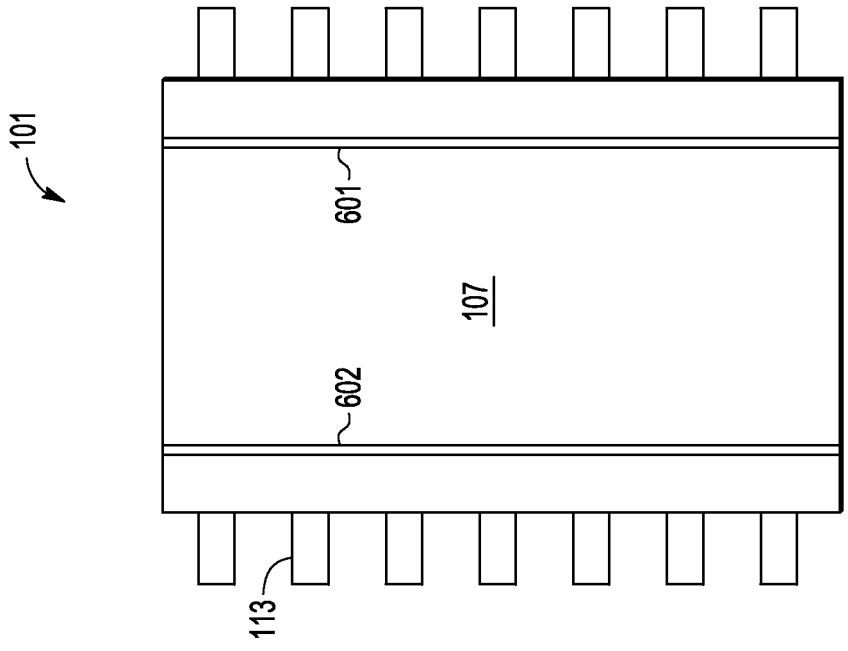
FIG. 8 is a top view of a microelectronic device package according to another embodiment of the present invention.

FIG. 8 is a top view of package 101 of the embodiment of FIG. 6. FIG. 8 shows that grooves 601 and 602 run along the sides of the package having leads 113. However, in other embodiments, grooves may be located on all sides of the top surface of a package. Also in other embodiments, the grooves running along a side may be discontinuous such that a groove would be separated from an adjacent groove running along its length.

In one embodiment, the grooves are formed by corresponding structures in the encapsulant mold. In other embodiments, the grooves may be formed by post encapsulation sawing or etching.

Including grooves in a package encapsulant acts to reduce stress on package by allowing the relatively unconstrained expansion and contraction of the encapsulant material with respect to the device flag over a number of temperature cycles. This unconstrained movement may prevent crack formation between the encapsulant and device flag.

Figure 9:
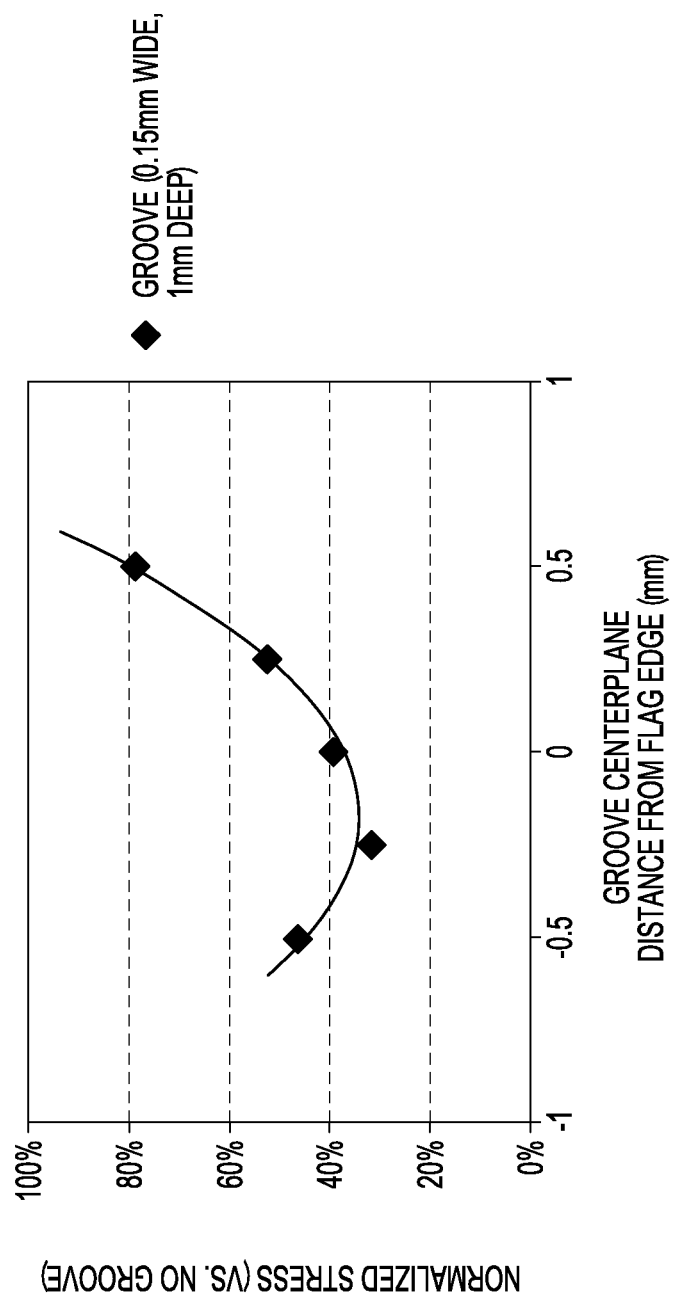
FIG. 9 is a graph illustrating an amount of stress reduction according to one embodiment of the present invention.

FIG. 9 is a graph showing the results of a two dimensional computer simulation of package stress for a package that included stress relieving grooves in the top surface normalized against a package that did not have such grooves. For the simulation, two 0.15 mm wide, 1 mm deep groves were simulated in a package having an encapsulation thickness of 2.35 mm and having a width of 18 mm. For the simulation, the die flag had a thickness of 0.25 mm, and a width of 11 mm. The simulated encapsulant was a multi aromatic type epoxy mold compound.

During the simulation, the package stress was measured for different grooves having center planes (606) located at various distances from the die flag edge (e.g. 128). The "0" value in FIG. 9 represents the simulation were the center planes of the grooves were each aligned with the corresponding die pad edges (e.g. edge 128). A negative value in the X axis represents a simulation where the center planes of the grooves were each located within the perimeter of the die flag (the center planes where located closer to the center of the die flag than the die flag edges). A positive value in the X axis represents a simulation where the center planes of the grooves are located outside a die flag edge perimeter (the center planes where located further from the center of the die flag than the die flag edges). The Y axis represents an amount of stress measured and normalized against a measured stress of a similar package without the stress relief grooves.

As shown by the graph, the greatest amount of stress reduction occurred where the center plane was offset form the pad edge (e.g. 128) by −0.25 mm. Referring back to FIG. 6, this maximum amount of stress reduction would occur where center plane 606 of groove 601 is located 0.25 mm to the left (relative to the view shown in FIG. 6) of flag edge 128.

Accordingly, providing a package with grooves having a center plane within 1 mm of the die flag edge may lead to stress reduction and therefore may reduce the likely hood of delimitation in a device package with an exposed substrate surface. In some embodiments, having the center plane within 0.5 mm of a die flag edge may lead to an even greater stress reduction.

In one embodiment, a microelectronic device package includes a package substrate, microelectronic component disposed on a first surface of a first portion of the substrate, and encapsulant material surrounding the microelectronic component. An exposed surface of the first portion of the substrate is exposed through an opening in a first major surface of the encapsulant material. The exposed surface of the first portion having an edge. Encapsulant material is adjacent to the edge at the first major surface. The exposed surface is opposite the first surface of the first portion. A stress relief feature is located in one of the first major surface or a second major surface of the encapsulant material. The second major surface is opposite the first major surface. The stress relief feature reduces an amount of the encapsulant material and is 1 mm or less from a plane of the edge of the exposed surface. The plane being generally perpendicular to the exposed surface.

In another embodiment, a microelectronic device package includes a substrate, a microelectronic device mounted on a first surface of the substrate, encapsulant material encapsulating the microelectronic device. An exposed surface of the substrate is exposed through a first major surface of the encapsulant material. The exposed surface includes an outer edge that is adjacent to the encapsulant material at the first major surface. The exposed surface is opposite the first surface. A groove is located in a second major surface of the encapsulant material. The first major surface is opposite the second major surface. The groove has an inner side wall and an outer side wall and a center plane between the inner and the outer side walls, the center plane including a first portion that runs generally parallel with and is 1 millimeter or less from the outer edge of the exposed surface of the substrate.

In another embodiment, a microelectronic device package includes a lead frame including a device flag, a microelectronic device mounted on a first side of the device flag, and encapsulant material encapsulating the microelectronic device and a portion of the device flag. A second side of the device flag is exposed through a first major surface of the encapsulant material. The second side of the device flag is opposite the first side. An edge of the device flag is adjacent to the encapsulant material at the first major surface of the encapsulant material. A stress relief groove is located in one of the first major surface or a second major surface of the encapsulant material. The second major surface is opposite the first major surface. The stress relief groove has a center plane including at least a portion that is generally parallel to the edge of the device flag and is 1 mm or less from the edge of the device flag.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A microelectronic device package comprising:
a package substrate;
microelectronic component disposed on a first surface of a first portion of the substrate;
encapsulant material surrounding the microelectronic component, an exposed surface of the first portion of the substrate is exposed through an opening in a first major surface of the encapsulant material, the exposed surface of the first portion having an edge, encapsulant material is adjacent to the edge at the first major surface, the exposed surface is opposite the first surface of the first portion;
one or more leads extending from a side surface of the encapsulant material, the side surface is perpendicular to the exposed surface of the first portion, the side surface is parallel to a plane aligned with the edge of the exposed surface;
a stress relief feature located in one of the first major surface or a second major surface of the encapsulant material, the second major surface is opposite the first major surface, the stress relief feature extends along the side surface having the one or more leads, the stress relief feature reduces an amount of the encapsulant material between an inner wall of the stress relief feature and the side surface, the inner wall is offset 1 mm or less from the plane aligned with the edge of the exposed surface, the plane being generally perpendicular to the exposed surface.

2. The package of claim 1 wherein:
the stress relief feature comprises a cutout in the second major surface of the encapsulant material, and
the package further comprises:
a groove in the first major surface of the encapsulant material, a center plane of the groove being generally parallel to the plane aligned with the edge of the exposed surface.

3. The package of claim 1 wherein:
the stress relief feature comprises a cutout in the first major surface of the encapsulant material, and
the package further comprises:
a second stress relief feature comprising a second cutout in the second major surface of the encapsulant material.

4. The package of claim 1 wherein:
the inner wall of the stress relief feature comprises a sloped surface oriented so that the encapsulant material is thinner at an outer edge of the encapsulant material generally parallel to the plane than at an inner region of the encapsulant material.

5. The package of claim 1 wherein:
the stress relief feature has a step-wise cross-section in a direction generally parallel to the plane.

6. The package of claim 1 wherein:
the inner wall of the stress relief feature comprises a vertical side wall that is generally parallel with the plane.

7. The package of claim 1 wherein the substrate is characterized as a lead frame and the first portion is a device flag of the lead frame.

8. A microelectronic device package comprising:
a substrate;
a microelectronic device mounted on a first surface of the substrate;
encapsulant material encapsulating the microelectronic device, wherein an exposed surface of the substrate is exposed through a first major surface of the encapsulant material, the exposed surface including an outer edge that is adjacent to the encapsulant material at the first major surface, the exposed surface is opposite the first surface;
one or more leads extending from a side surface of the encapsulant material, the side surface is perpendicular to the exposed surface of the substrate, the side surface is parallel to a plane aligned with the outer edge, an outer region of the encapsulant material is located between the plane and the side surface;
a cutout in a second major surface of the encapsulant material, wherein the first major surface is opposite the second major surface, the cutout extends along the side surface having the one or more leads, the cutout reduces an amount of the encapsulant material from the outer region, the cutout has an inner side wall that is offset 1 millimeter or less from the plane aligned with the outer edge of the exposed surface of the substrate.

9. The package of claim 8, wherein:
the cutout is located above wires connecting the one or more leads to the microelectronic device.

10. The package of claim 8, wherein:
the substrate includes a device flag, the microelectronic device is mounted on a first surface of the device flag, the exposed surface is a surface of the device flag, wherein the inner side wall is 1 millimeter or less from an edge of the device flag.

11. The package of claim 10 wherein the device flag is predominately copper or a copper alloy.

12. The package of claim 8 wherein
the package further comprises:
a second cutout in the first major surface of the encapsulant material, the second cutout has a second inner side wall that is offset 1 millimeter or less from the plane aligned with the outer edge of the exposed surface of the substrate.

13. The package of claim 12 wherein the second inner side wall is 0.5 millimeter or less from the plane aligned with the outer edge of the exposed surface of the substrate.

14. The package of claim 8 wherein the inner side wall is 0.5 millimeter or less from the plane aligned with the outer edge of the exposed surface of the substrate.

15. The package of claim 8 further comprising:
a groove in the first major surface of the encapsulant material, the groove has an inner side wall and an outer side wall and a center plane between the inner and the outer side walls, the center plane of the second groove including a first portion that runs generally parallel with and is 1 millimeter or less from the plane aligned with the outer edge of the exposed surface of the substrate.

16. A microelectronic device package comprising:
a lead frame including a device flag and a plurality of leads;
a microelectronic device mounted on a first side of the device flag;
encapsulant material encapsulating the microelectronic device and a portion of the device flag, a second side of the device flag is exposed through a first major surface of the encapsulant material, the second side of the device flag is opposite the first side, an edge of the device flag is adjacent to the encapsulant material at the first major surface of the encapsulant material;
the plurality of leads extending from a side surface of the encapsulant material, the side surface is perpendicular to the second side of the device flag, the side surface is parallel to a plane aligned with the edge of the device flag;

a stress relief feature located in one of the first major surface or a second major surface of the encapsulant material, the second major surface is opposite the first major surface, the stress relief feature extends along the side surface having the one or more leads, the stress relief feature reduces an amount of the encapsulant material between an inner wall of the stress relief feature and the side surface, the inner wall is offset 1 mm or less from the plane aligned with the edge of the device flag.

17. The package of claim 16 wherein:

the stress relief feature is located in the second major surface.

18. The package of claim 17 wherein:

the package further comprises a groove located in the first major surface.

19. The package of claim 17 wherein the inner wall is 0.5 millimeter or less from the edge of the device flag.

20. The package of claim 16 wherein:

the stress relief feature comprises a cutout in an outer edge of at least one of the first major surface or the second major surface of the encapsulant material, the cutout is oriented so that the encapsulant material is thinner at an outer edge of the encapsulant material than at an inner region of the encapsulant material.

\* \* \* \* \*